(12) United States Patent
Wu

(10) Patent No.: US 6,753,553 B2
(45) Date of Patent: Jun. 22, 2004

(54) LED MATRIX SUBSTRATE WITH CONVECTION HOLES

(76) Inventor: Jiahn-Chang Wu, No. 15, Alley 13, Lane 439, Herchiang Street, Chutung, Hsinchu (TW)

(*) Notice: Subject to any disclaimer, the term of this patent is extended or adjusted under 35 U.S.C. 154(b) by 46 days.

(21) Appl. No.: 10/172,728

(22) Filed: Jun. 17, 2002

(65) Prior Publication Data

US 2003/0230752 A1 Dec. 18, 2003

(51) Int. Cl.[7] .............................................. H01L 21/00
(52) U.S. Cl. .............................. 257/88; 257/81; 257/98
(58) Field of Search .............................. 257/81, 88, 98, 257/697, 698, 775, 90

(56) References Cited

U.S. PATENT DOCUMENTS

| | | | | |
|---|---|---|---|---|
| 5,355,942 A | * | 10/1994 | Conte | 438/81 |
| 6,121,553 A | * | 9/2000 | Shinada et al. | 174/259 |
| 6,383,835 B1 | * | 5/2002 | Hata et al. | 438/65 |

* cited by examiner

*Primary Examiner*—Long Pham
*Assistant Examiner*—Hoa B. Trinh
(74) *Attorney, Agent, or Firm*—H. C. Lin Patent Agent

(57) ABSTRACT

Through-holes are inserted in the substrate of an LED matrix to increase air circulation and cooling. Fans may be used to increase cooling.

8 Claims, 5 Drawing Sheets

LED MATRIX SUBSTRATE WITH CONVECTION HOLES

BACKGROUND OF THE INVENTION

1. Field of the Invention

This invention relates light emitting diode (LED) packages, particularly to the substrate of LED matrix packages.

2. Brief Description of Related Art

FIG. 1 shows a prior art substrate 10 for a LED matrix. On the substrate 10 are first group of printed circuits 11 with bonding pads 11B, and second group of printed circuits 12 with bonding pads 12B. Mounted on the first group of bonding pads 11B are light emitting diodes (LED) 15, each having a bottom electrode and a top electrode. Wire-bonded through wires 14 to the second group of bonding pads 12B are the top electrodes of the LEDs 15. This kind of substrate can only remove the heat generated in the LEDs 15 through the top surface, the bottom surface and the thin side edges. This kind of structure does not remove the heat efficiently.

SUMMARY OF THE INVENTION

An object of this invention is to provide efficient heat removal of an LED matrix. Another object of this invention is to increase the reliability of the LED matrix.

These objects are achieved by providing through holes in the substrate for air ventilation or convection. Fans may be used to force the air through these holes and to increase convection.

BRIEF DESCRIPTION OF THE DRAWINGS

The through-holes 20 shown in FIG. 2 need not be of equal rectangular shape.

The through-holes 201 shown in FIG. 3 need not be of rectangular shape.

The LEDs shown in FIGS. 1–4 have each a bottom electrode and a top electrode. For LEDs with two bottom electrodes, the same heat removal technique can be applied.

Figure 1:
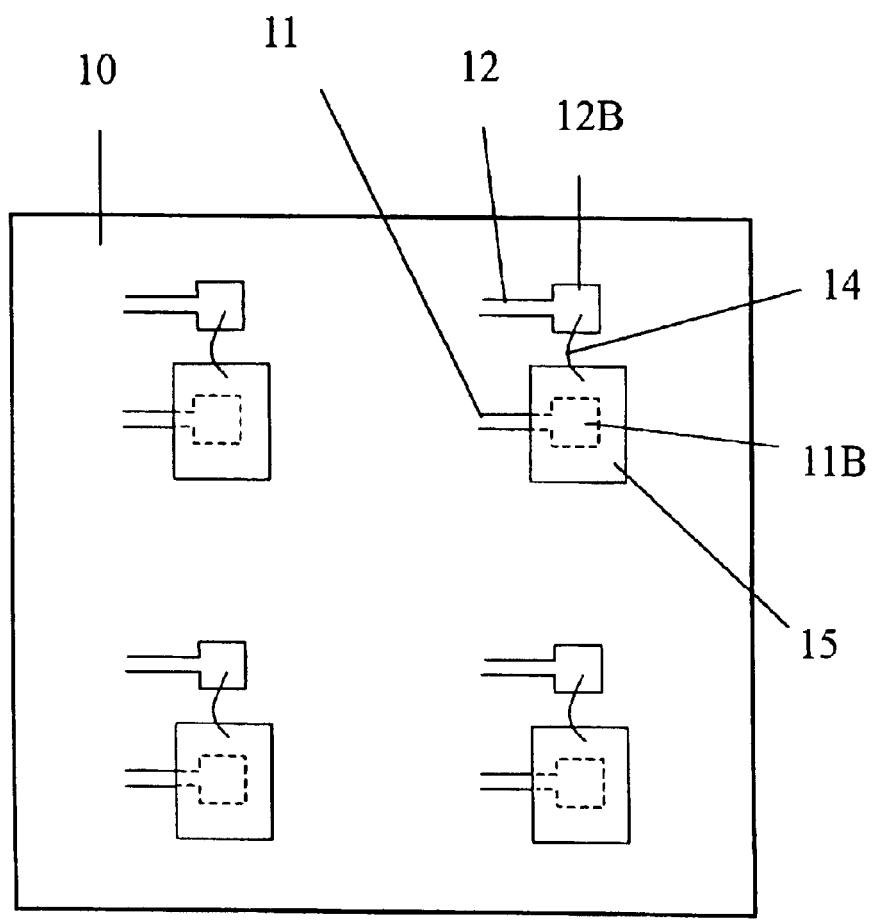
Figure 2:
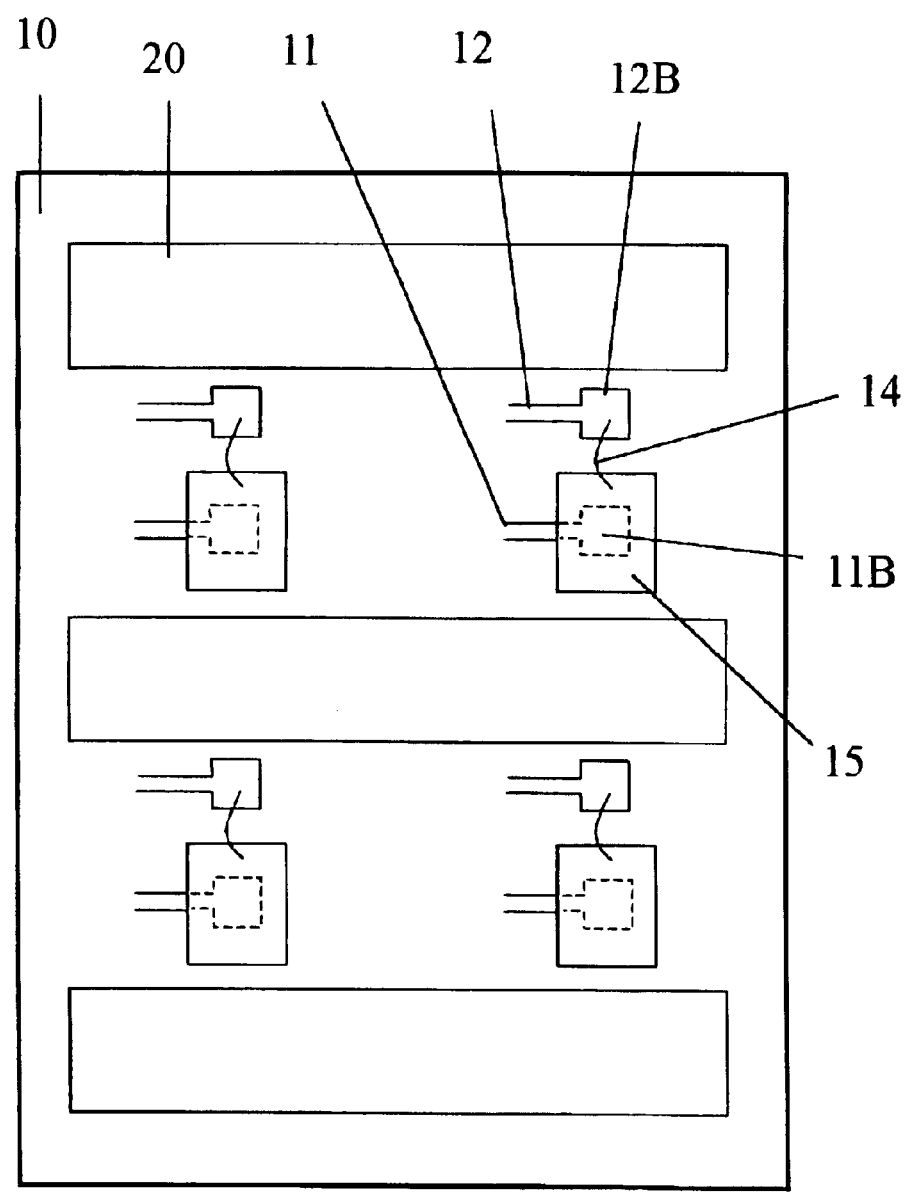
FIG. 2 shows the basic structure of the present invention. The first group of printed circuits 11 with bonding pads 11B, the second group of printed circuits 12 with bonding pads 12B bonded with bonding wires 14, and the LEDs 15 correspond to the parts with the same reference numerals in the conventional circuit board 10 as shown in FIG. 1. The difference is that the substrate 10 has through holes 20 inserted in areas where there are no printed circuits. These through-holes occupy substantial portion of the substrate. Air flowing through these through-holes increases convection, thereby lowering the temperature of the LEDs. Forced air by means of a fan can further increase cooling.
Figure 3:
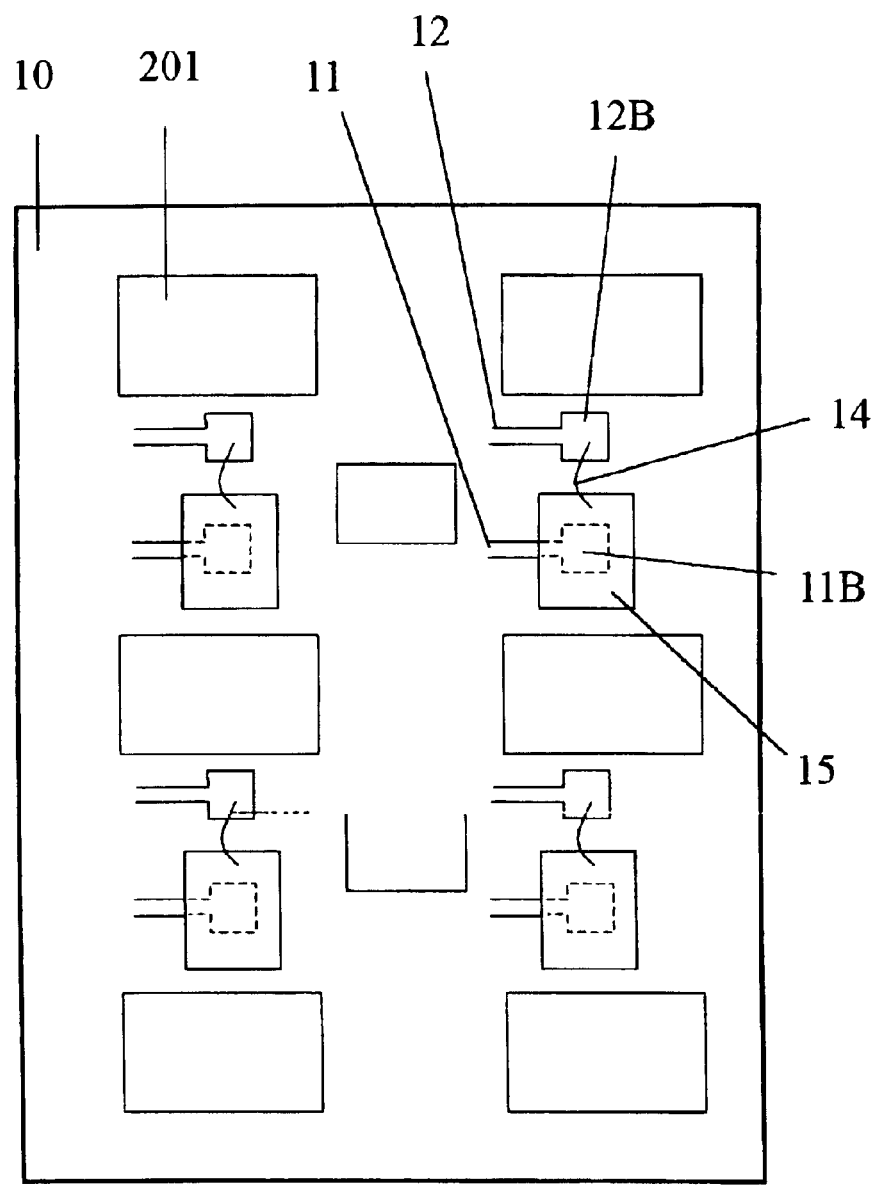
FIG. 3 shows a second embodiment of the present invention, where the rectangular through-holes 201 are of unequal sizes. Otherwise, the parts shown in FIG. 3 correspond to the parts with the same reference numerals as that in FIG. 2.
Figure 4:
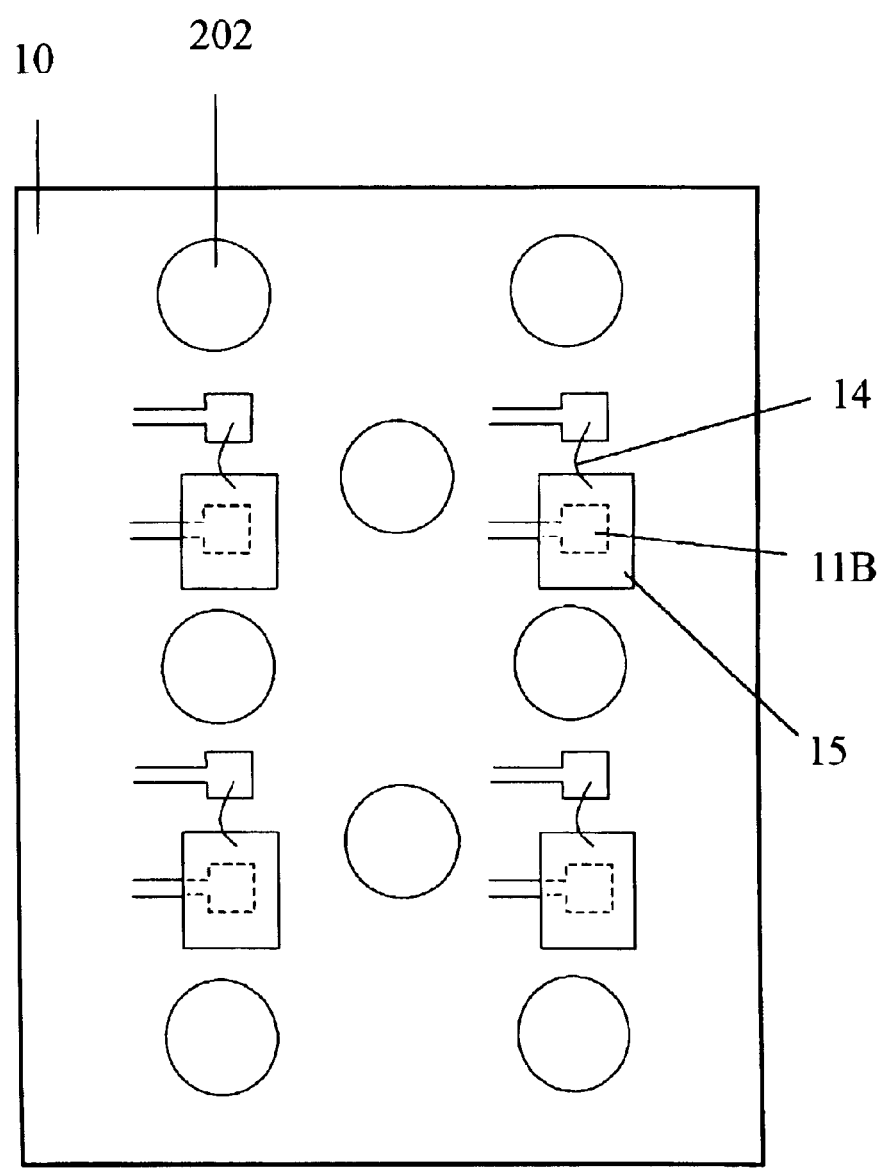
FIG. 4 show a third embodiment of the present invention. The through-holes 202 are of circular shape. Otherwise, the parts shown in FIG. 4 correspond to the parts with the same reference numerals as that in FIG. 3.
Figure 5:
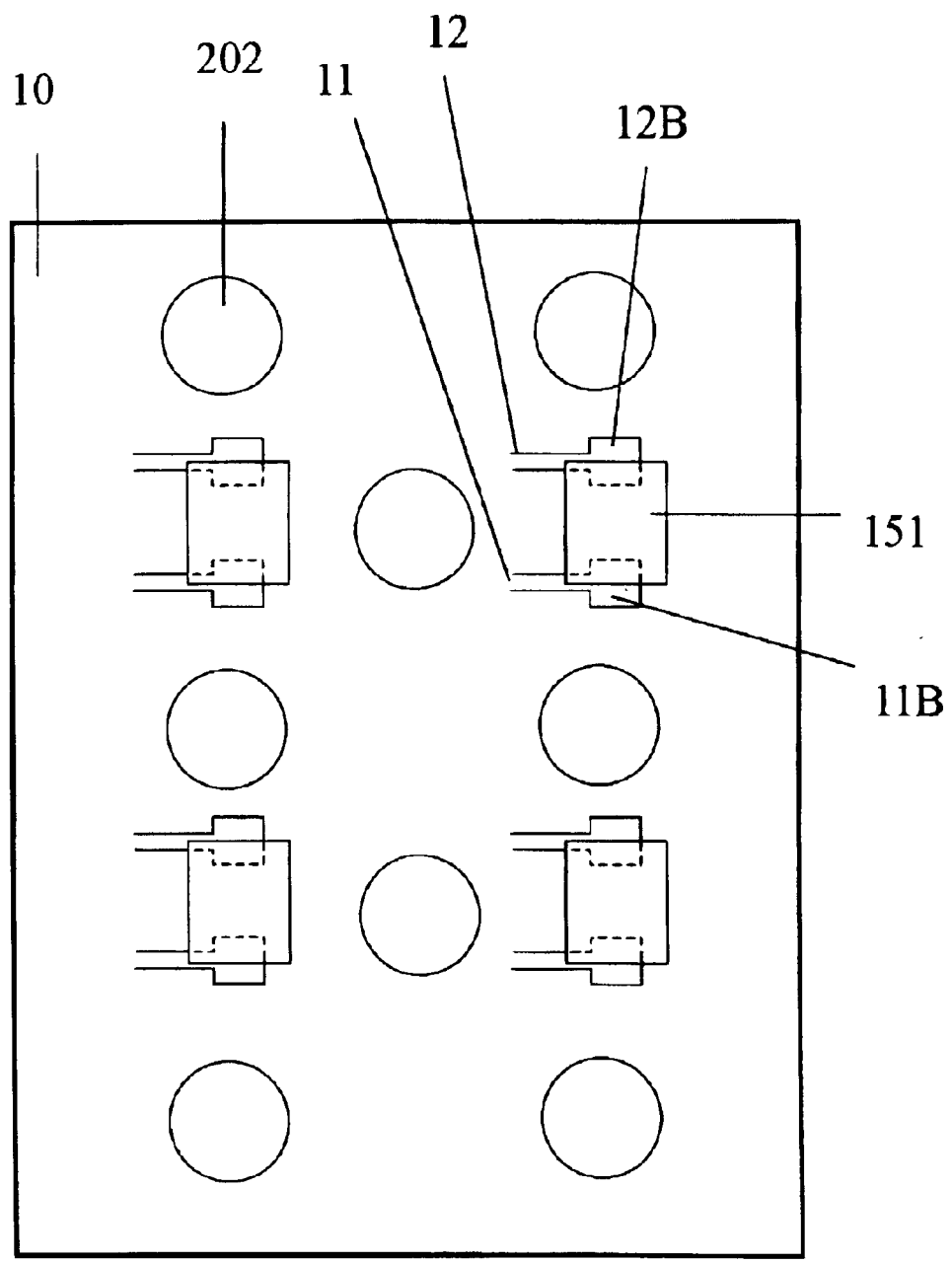
FIG. 5 shows a fourth embodiment of the present invention. A first group of printed wires 11 has each a bonding pad 11B, and a second group of printed wires 12 has each a bonding pad 12B. Each LED with two bottom electrodes bridges over the bonding pads 11B and 12B. Through-holes 202 are inserted in the substrate 10 for air convection.

While the preferred embodiments have been described, it will be apparent to those skilled in the art that various modifications can be made in the embodiments without departing from the spirit of the present invention. Such modifications are all within the scope of this invention.

What is claim is:

1. A light emitting diode (LED) matrix package, comprising:

a matrix of LED, each having a first electrode and a second electrode;

a substrate for mounting said LEDs;

a first group of printed wiring on said substrate each having a first bonding pad for bonding to said first electrode;

a second group of printed wiring on said substrate each having a second bonding pad for bonding to said second electrode; and ventilating through-holes, uncut, uncovered and inside the border of said substrate for air-flow to increase convection and cooling.

2. The LED matrix package as described in claim 1, wherein said ventilating through-holes are of rectangular shape.

3. The LED matrix package as described in claim 2, wherein said ventilating through-holes are of unequal rectangular shapes.

4. The LED matrix package as described in claim 1, wherein said ventilating through-holes are of circular shape.

5. The LED matrix package as described in claim 1, wherein said first electrode is a bottom electrode and second electrode is a top electrode.

6. The LED matrix package as described in claim 5, wherein said top electrode is wire-bonded.

7. The LED matrix package as described in claim 1, wherein said first electrode is a bottom electrode and said second electrode is a second bottom electrode.

8. The LED matrix package as described in claim 1, further comprising forced air from a fan to increase said convection.

* * * * *